(12) United States Patent
Arai et al.

(10) Patent No.: US 8,044,488 B2
(45) Date of Patent: Oct. 25, 2011

(54) SEMICONDUCTOR DEVICE HAVING PARTICULAR IMPURITY DENSITY CHARACTERISTICS

(75) Inventors: Mitsuru Arai, Kodaira (JP); Shinichiro Wada, Fuchu (JP); Hideyuki Hosoe, Ome (JP)

(73) Assignees: Hitachi, Ltd., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 469 days.

(21) Appl. No.: 12/144,042

(22) Filed: Jun. 23, 2008

(65) Prior Publication Data

US 2009/0014838 A1 Jan. 15, 2009

(30) Foreign Application Priority Data

Jul. 11, 2007 (JP) ................................. 2007-181610

(51) Int. Cl.
*H01L 21/70* (2006.01)
(52) U.S. Cl. ................. 257/511; 257/565; 257/E29.034
(58) Field of Classification Search .......... 257/500–502, 257/511–512, 525–527, 557–564, 592–593, 257/549, 565, 591, E29.034
See application file for complete search history.

(56) References Cited

U.S. PATENT DOCUMENTS

| 5,976,921 | A | * | 11/1999 | Maeda | 438/202 |
| 2002/0036326 | A1 | * | 3/2002 | DeJong et al. | 257/369 |
| 2004/0048428 | A1 | * | 3/2004 | Tanomura | 438/199 |

FOREIGN PATENT DOCUMENTS

| JP | 11-008315 | 1/1999 |
| JP | 2004-363267 | 12/2004 |
| JP | 2006-054261 | 2/2006 |

* cited by examiner

*Primary Examiner* — Kenneth Parker
*Assistant Examiner* — Jose R Diaz
(74) *Attorney, Agent, or Firm* — Brundidge & Stanger, P.C.

(57) ABSTRACT

The invention is based upon a semiconductor device where a high voltage bipolar transistor is manufactured on the same wafer with a high-speed bipolar transistor, and has a characteristic that the high-speed bipolar transistor and the high voltage bipolar transistor are formed on each epitaxial collector layer having the same thickness and are provided with a buried collector region formed in the same process and having the same impurity profile, the buried collector region exists immediately under a base of the high-speed bipolar transistor, no buried collector region and no SIC region exist immediately under a base of the high voltage bipolar transistor and distance between a base region and a collector plug region of the high voltage bipolar transistor is equal to or is longer than the similar distance of the high-speed bipolar transistor.

19 Claims, 12 Drawing Sheets

SEMICONDUCTOR DEVICE HAVING PARTICULAR IMPURITY DENSITY CHARACTERISTICS

CLAIM OF PRIORITY

The present application claims priority from Japanese patent application JP 2007-181610 filed on Jul. 11, 2007, the content of which is hereby incorporated by reference into this application.

FIELD OF THE INVENTION

The present invention relates to a semiconductor device where plural bipolar transistors mutually different in collector-emitter breakdown voltage are manufactured on the same wafer, and more particularly to a semiconductor device where a high voltage bipolar transistor is manufactured on the same wafer with a high-speed bipolar transistor.

BACKGROUND OF THE INVENTION

For an example of a conventional type, a semiconductor device where a high voltage bipolar transistor is manufactured on the same wafer with a high-speed bipolar transistor can be given (for example, refer to patent documents 1 to 3, JP-A No. 1999-8315, JP-A No. 2006-54261 and JP-A No. 2004-363267).

SUMMARY OF THE INVENTION

Recently, demands for making an integrated circuit multifunctional by mounting an amplifier that requires high-speed operation and an output circuit that requires high-voltage in one chip together increase. Generally, as high-speed operation and high voltage are in the relation of a trade-off and it is difficult to simultaneously realize them, technique for realizing them by providing transistors different in breakdown voltage on the same wafer is proposed.

For example, in the patent documents 1 to 3, each semiconductor device where a high voltage bipolar transistor is manufactured on the same wafer with a high-speed bipolar transistor is described. However, inventors of the invention found that the above-mentioned related art had the following problems by themselves.

In the case of the NPN transistor according to the related art the sectional view of which is shown in FIG. 1 in the patent document 1, to explain it using reference numerals in the document, two different N-type epitaxial collector layers 4, 7 are provided so as to form the high-speed bipolar transistor and the high voltage bipolar transistor on the same wafer, and the thickness of the epitaxial collector layer in each bipolar transistor is differentiated. In the bipolar transistors, N'-type buried layers 2, 5 different in depth are formed. Therefore, as an intricate process is required to manufacture the device having such structure, the device has a problem that the manufacturing cost increases.

In the case of the related art the sectional view of which is shown in FIG. 1 in the patent document 2, to explain it using reference numerals in the document, impurity density profiles of buried collector layers 11, 12 of the bipolar transistors are mutually different. Collector-emitter breakdown voltage is mutually differentiated by increasing the impurity density of the buried collector layer in the high-speed bipolar transistor and increasing the width of the layer and by relatively decreasing the impurity density of the buried collector layer in the high voltage bipolar transistor and thinning the layer. Therefore, to realize the above-mentioned structure, impurities different in a diffusion coefficient are required to be selectively doped and as an intricate process is also required as in the patent document 1 when the device having the above-mentioned structure is manufactured, the device has a problem that the manufacturing cost increases.

In the case of the related art the sectional view of which is shown in FIG. 6 in the patent document 3, to explain it using reference numerals in the document, a thick-film region the thickness of a mask of which is thicker than another region is formed immediately under a region to be at least an emitter region in a region for a buried region 10 of the high voltage transistor 7 on the semiconductor substrate 1 to be formed and afterward, the buried region the impurity density of which is locally decreased is formed under the thick-film region by diffusing impurities. It is considered that a semiconductor device where high-speed SiGeHBT 6 and high voltage SiGe-HBT 7 are mounted on the same wafer is acquired according to the process. Therefore, to realize this structure, the thickness of an oxide film in ion implantation in a part the density of which is to be locally low in a buried region 10 of the high voltage transistor 7 is required to be locally thickened and therefore, the number of processes is increased. Accordingly, when a device having such structure is manufactured, the device also has a problem that the manufacturing cost is increased because an intricate process is required as in the patent documents 1 and 2.

FIG. 7 shows device configuration examined by the inventors on their own terms prior to the invention and shows one example of sectional structure when bipolar transistors having different characteristics are formed on the same wafer by separate means from the patent documents 1 to 3. The high-speed bipolar transistor and the high voltage bipolar transistor are formed on each epitaxial collector layer 7 having the same thickness and are provided with each buried collector region 5 formed in the same process and having the same impurity density profile. The high-speed bipolar transistor is provided with an N$^+$-type selective ion-implanted collector (SIC) region 8 in an N$^-$-type collector region immediately under a base region so as to improve high frequency characteristics and the high voltage bipolar transistor is provided with no SIC region 8.

FIG. 8 shows relation between a current gain cut-off frequency ($f_T$) and collector-emitter breakdown voltage by the open base (BV$_{CEO}$) as a part of a result of the evaluation of electric characteristics of the bipolar transistors having the sectional structure shown in FIG. 7 and produced by way of trial by the inventors. The thickness of the epitaxial collector layer 7 in the trial production is 0.3 μm for example. A manufacturing process in the case of the sectional structure shown in FIG. 7 is greatly simplified, compared with those in the patent documents 1 and 2, however, in the meantime, a result of the trial production tells that the sectional structure has a problem that as shown in FIG. 8, the collector-emitter breakdown voltage by the open base (BV$_{CEO}$) of the high voltage bipolar transistor can be increased only by approximately 1 V, compared with the high-speed bipolar transistor.

FIGS. 9A and 9B show one example of the configuration of a circuit for driving a magnetic head that requires a high voltage bipolar transistor. Particularly, FIG. 9A shows an example of circuit configuration when the collector-emitter breakdown voltage of the bipolar transistor (BJT) is enough. In this case, the circuit configuration is relatively simple. As voltage equal to or exceeding VCC+VEE is applied between each collector and each emitter of bipolar transistors Q2 and Q3 in consideration of overshoot characteristics in high-frequency operation and others, collector-emitter breakdown voltage equal to or exceeding 10 V for example is required. In the meantime, as high-speed switching performance is required for an internal circuit, the collector-emitter breakdown voltage has only to be approximately 5 V or less. That is, as the difference of 5 V or more in breakdown voltage is required between the high voltage bipolar transistor and a high-speed bipolar transistor, it is difficult to realize a semiconductor device where the high voltage transistor for driving the magnetic head and the high-speed transistor as the internal circuit are mounted together by the related art shown in FIG. 7 and showing the characteristic in FIG. 8. FIG. 9B shows an example of circuit configuration when the collector-emitter breakdown voltage of the transistor (BJT) is not enough. The shortage of the breakdown voltage of the device itself can be also supplemented by devising the circuit as shown in FIG. 9B, however, in this case, intricate circuit design is required, and side reaction that circuit area is increased is produced. Further, a problem that a band of the circuit is deteriorated by a parasitic capacity component of a MOS transistor is also caused.

The invention provides a semiconductor device where plural high voltage bipolar transistors different in collector-emitter breakdown voltage can be easily manufactured on the same wafer without adding a special process to a manufacturing process of a high-speed bipolar transistor.

The outline of representatives of the invention disclosed in this application will be briefly described below.

That is, a semiconductor device according to an aspect of the invention is based upon a semiconductor device including a semiconductor substrate, a first bipolar transistor and a second bipolar transistor the collector-emitter breakdown voltage of which is higher than that of the first bipolar transistor respectively formed on the semiconductor substrate in common and has a characteristic that the first and second bipolar transistors are respectively provided with an epitaxial collector layer having the substantially same thickness and a buried collector region having the substantially same impurity density profile, the buried collector region exists immediately under a base region of the first bipolar transistor and no buried collector region exists immediately under a base region of the second bipolar transistor.

As for the characteristic of the buried collector region, it can be also considered that the buried collector region of the first bipolar transistor exists under the base region and the buried collector region of the second bipolar transistor selectively exists only under a collector plug region. Or it can be also considered that when the first and second bipolar transistors are provided with a low-density collector region the impurity density of which is lower than that of the buried collector region, the buried collector region exists under the base region of the first bipolar transistor and an insulating layer of the semiconductor substrate and the low-density collection region are directly touched under the base region of the second bipolar transistor.

It is desirable that the buried collector region exists immediately under or below the collector plug region of the second bipolar transistor.

It is desirable that the impurity density of the collector region immediately under or below the base region of the first bipolar transistor is higher than the impurity density of the collector region immediately under or below the base region of the second bipolar transistor.

It is desirable that the epitaxial collector layer immediately under or below the base region of the second bipolar transistor includes no lower-resistance region, compared with the epitaxial collector layer around it. Conversely, it is desirable that the epitaxial collector layer immediately under or below the base region of the first bipolar transistor includes a lower-resistance region, compared with the epitaxial collector layer around it, however, the invention is not limited to this.

It is desirable that distance between the base region and the collector plug region of the second bipolar transistor is equal to or is longer than distance between the base region and a collector plug region of the first bipolar transistor.

It is desirable that the second bipolar transistor includes plural bipolar transistors different in distance between each base region and each collector plug region.

It is desirable that two collector plug regions of the second bipolar transistor are arranged in opposite positions with one emitter region between the collector plug regions. For example, the two collector plug regions may also be arranged on both right and left sides of the emitter region.

According to the invention, the plural bipolar transistors different in collector-emitter breakdown voltage can be manufactured on the same wafer in a simple process.

DETAILED DESCRIPTION OF THE PREFERRED EMBODIMENTS

Figure 1:
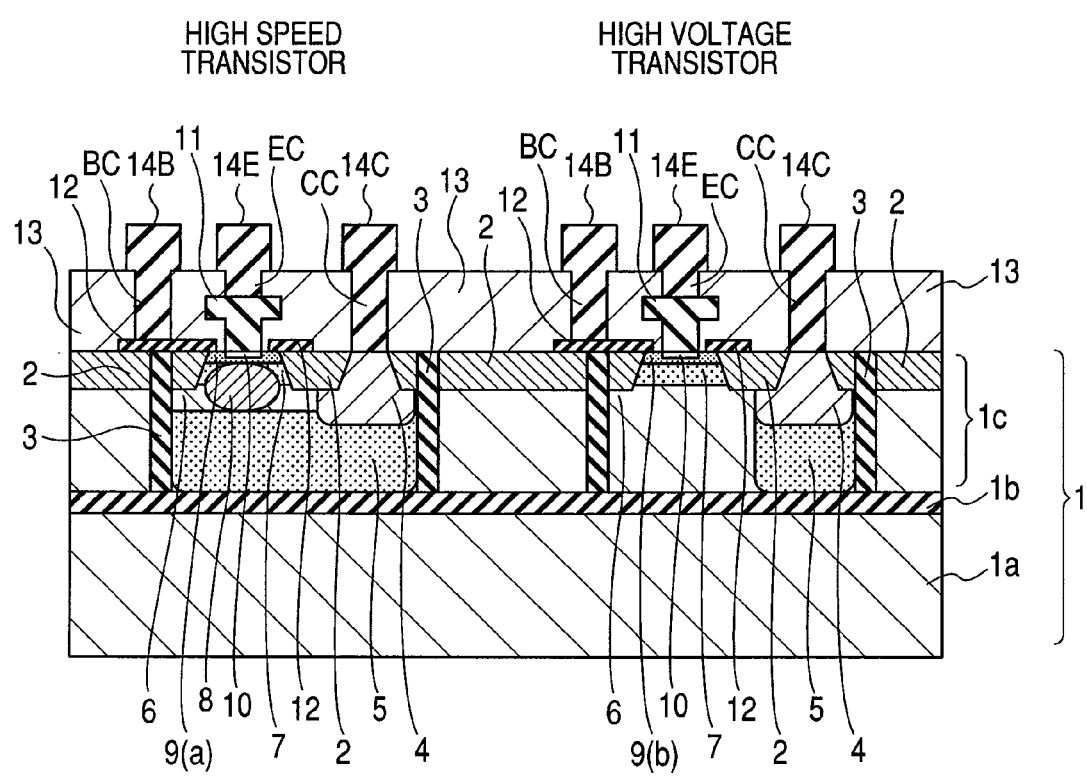
FIG. 1 is a sectional view showing one embodiment of the invention.

Referring to the drawings, embodiments of the invention will be described in detail below. In the following each embodiment, a referred transistor basically denotes a bipolar transistor.

First Embodiment

FIG. 1 shows the sectional structure of an NPN transistor equivalent to one embodiment of the invention. The semiconductor device equivalent to this embodiment is based upon a semiconductor device including a semiconductor substrate 1, a first bipolar transistor (for example, a high-speed transistor) and a second bipolar transistor (for example, a high voltage transistor) the collector-emitter breakdown voltage of which is higher than that of the first bipolar transistor respectively formed on the semiconductor substrate 1 in common. The semiconductor device equivalent to this embodiment has a characteristic that the first and second bipolar transistors are provided with each epitaxial collector layer 7 having the substantially same thickness, are provided with each buried collector region 5 having the substantially same impurity density profile, the buried collector region 5 exists immediately under and below a base region 9(a) of the first bipolar transistor and the buried collector region 5 does not exist immediately under and below a base region 9(b) of the second bipolar transistor.

However, as for the characteristic of the buried collector region 5, it can be also considered that the buried collector region 5 of the first bipolar transistor exists under and below the base region 9(a) as described above and the buried collector region 5 of the second bipolar transistor selectively exists only under a collector plug region 4. Or when the first and second bipolar transistors are provided with each low density collector region 6 which is lower in impurity density than each buried collector region 5, it can be also considered that the buried collector region 5 exists under and below the base region 9(a) of the first bipolar transistor and an insulating layer 1b of the semiconductor substrate 1 and the low density collector region 6 are directly in contact under and below the base region 9(b) of the second bipolar transistor.

FIG. 1 shows an example of the structure of the semiconductor device including the insulation isolation transistors using the SOI substrate, however, a semiconductor device including an insulation isolation transistor using a bulk substrate is also included in a scope of the invention. When the SOI substrate is used, effect that insulation performance between adjacent elements (an isolation characteristic) can be improved can be expected, compared with a case that the bulk substrate is used. In the meantime, when the bulk substrate is used, effect that the thermal resistance of a device can be reduced and the deterioration of the performance by the self-heating effect of the device can be improved can be expected, compared with a case that the SOI substrate is used.

Besides, FIG. 1 shows the example of the NPN transistor for a conductive type; however, in the scope of the invention, both the NPN transistor and a PNP transistor are also included. Transistor structure may be also Si bipolar structure and hetero-structure.

In the example of the device structure shown in FIG. 1, an N$^+$-type selective ion-implanted collector (SIC) region 8 is provided in an N$^-$ collector region immediately under the base region 9 of the first high-speed transistor so as to improve a high frequency characteristic. In this case, the impurity density of the collector region 8 immediately under or below the base region 9(a) of the first bipolar transistor is higher than the impurity density of the collector region 6 immediately under or below the base region 9(b) of the second bipolar transistor. Effect that a current gain cut-off frequency ($f_T$) can be improved can be expected because the SIC region 8 exists. However, in the scope of the invention, a semiconductor device without the SIC region 8 of the first high-speed transistor is also included. In this case, as the SIC region 8 dare not be provided, effect that collector-base breakdown voltage by the open emitter ($BV_{CBO}$) can be enhanced and collector-emitter breakdown voltage by the open base ($BV_{CEO}$) can be also enhanced can be expected.

The first high-speed transistor and the second high voltage transistor are provided with each N$^-$ epitaxial collector layer 7 having the same thickness of 0.3 μm for example and are provided with each buried collector region 5 having the same impurity density profile. The buried region 5 exists immediately under the base region 9(a) in the first high-speed transistor; however, it is not formed immediately under the base region 9(b) in the second high voltage transistor. No SIC region 8 is formed in the second high voltage transistor. That is, the epitaxial collector layer 7 immediately under or below the base region 9(b) of the second bipolar transistor includes no region the resistance of which is lower than the resistance of the epitaxial collector layer 7 around it. Conversely, the epitaxial collector layer 7 immediately under or below the base region 9(a) of the first bipolar transistor basically includes the region 8 the resistance of which is lower than the resistance of the epitaxial collector layer 7 around it, however, as described above, the epitaxial collector layer may have no region. Further, the buried collector region 5 of the second high voltage transistor shall be provided only under the collector plug region 4. That is, the buried collector region 5 exists immediately under or below the collector plug region 4 of the second bipolar transistor.

Owing to this configuration, effect that the collector-base breakdown voltage by the open emitter ($BV_{CBO}$) can be enhanced in the second high-voltage transistor, compared with the first high-speed transistor and the collector-emitter breakdown voltage by the open base ($BV_{CEO}$) can be also enhanced is produced.

Distance between the base region 9(b) of the second bipolar transistor and the collector plug region 4 is equal to or longer than distance between the base region 9(a) of the first bipolar transistor and the collector plug region 4. The larger difference between the distance in the second bipolar transistor and the distance in the first bipolar transistor is, the larger the resistance to high voltage of the second bipolar transistor is, however, conversely, effect that the smaller the difference is, the higher the current gain cut-off frequency ($f_T$) of the second bipolar transistor is can be expected, compared with a case that the difference is increased. It is normally not performed for circumstances in the design of a chip to make the distance in the second bipolar transistor smaller than the distance in the first bipolar transistor.

As described above, as for the second high voltage transistor, the buried collector region 5 and the epitaxial-collector layer 7 are formed on the same condition as the first high-speed transistor, no SIC region 8 is provided differently from the first high-speed transistor, and the buried collector region 5 is selectively provided only under the collector plug region 4. Therefore, a special process for forming the second high voltage transistor is not required and the manufacturing cost can be reduced, compared with the related art disclosed in the patent documents 1 and 2.

According to this embodiment, the plural bipolar transistors different in collector-emitter breakdown voltage can be mounted together on the same wafer in a simple process.

Second Embodiment

Figure 2:
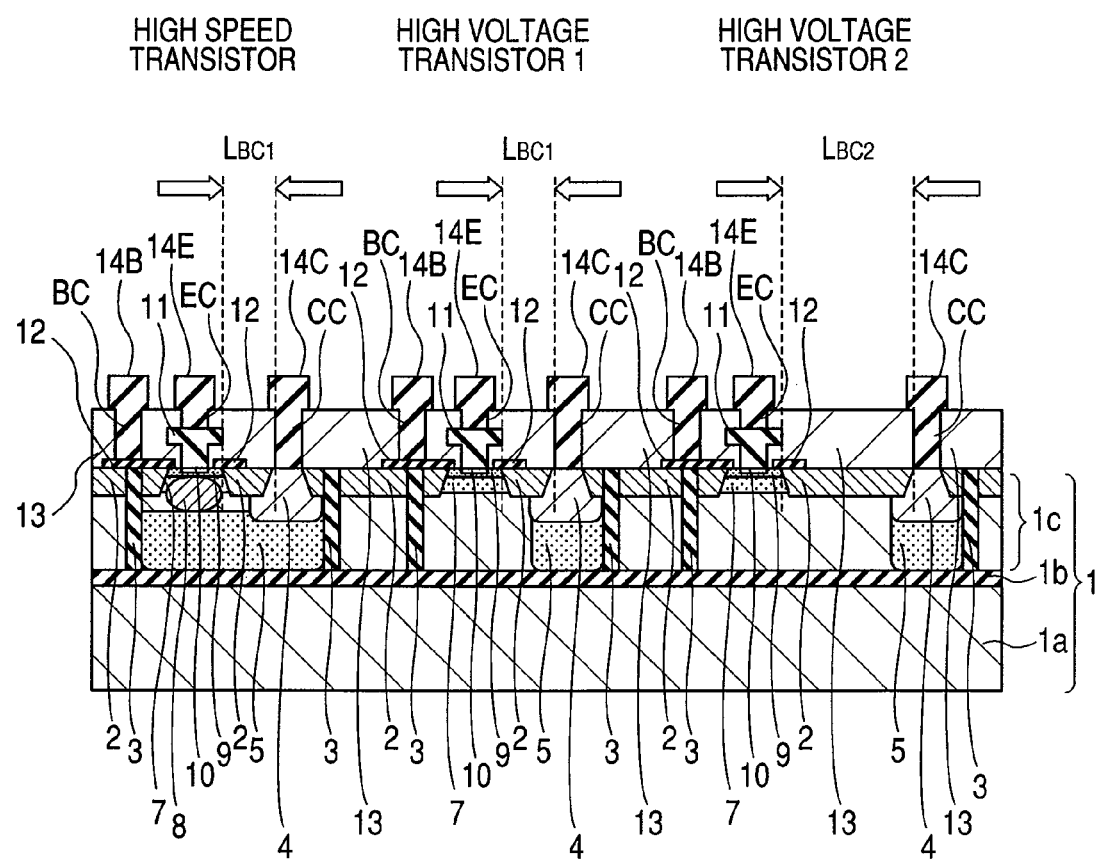
FIG. 2 is a sectional view showing another embodiment of the invention.

FIG. 2 shows the sectional structure of another embodiment of the invention. It is different from the structure shown in FIG. 1 that different plural transistors are formed for a second transistor (for example, a high voltage transistor) mounted together on the same semiconductor substrate 1 as a first transistor (for example, a high-speed transistor). For example, in FIG. 2, the high voltage transistor 2 is further formed on the same wafer in addition to the high voltage transistor 1 and one example of the sectional structure when these two high voltage transistors form the second transistor is shown. A buried collector region 5 and an epitaxial collector layer 7 of the high voltage transistor 2 are formed as in the first and second transistors. Distance ($L_{BC}2$) between a base region 9 and a collector plug region 4 in the third high voltage transistor 2 is longer than distance ($L_{BC}1$) between a base region 9 and a collector plug region 4 in the second high voltage transistor 1. Hereby, collector-base breakdown voltage by the open emitter ($BV_{CBO}$) in the third high voltage transistor 2 is larger than that in the second high voltage transistor 1 and collector-emitter breakdown voltage by the open base ($BV_{CEO}$) is also larger.

Figure 3A:
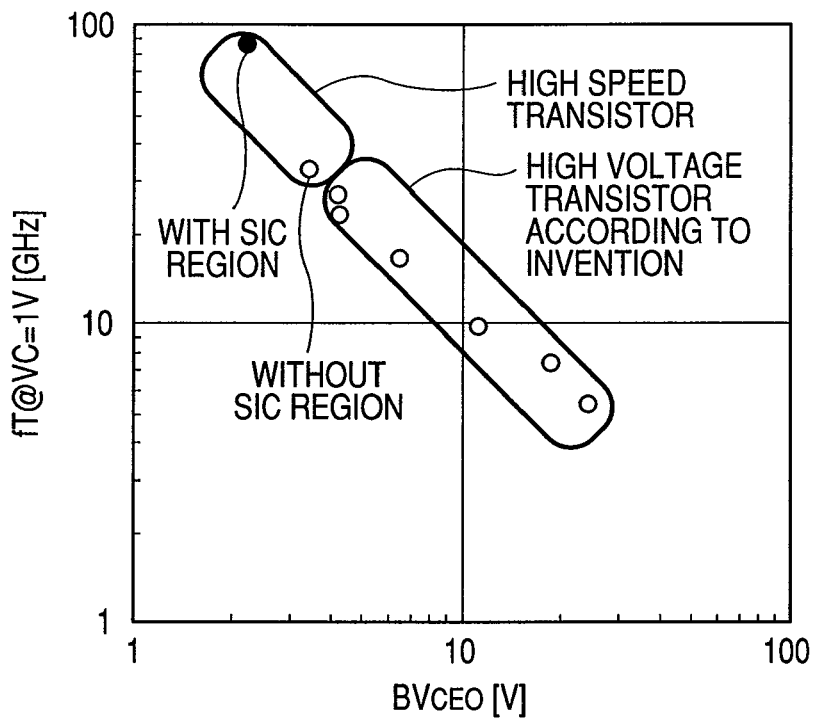
FIG. 3A shows relation between a current gain cut-off frequency ($f_T$) and collector-emitter breakdown voltage by the open base ($BV_{CEO}$) as a result of the evaluation of electric characteristics in the embodiment shown in FIG. 2
Figure 3B:
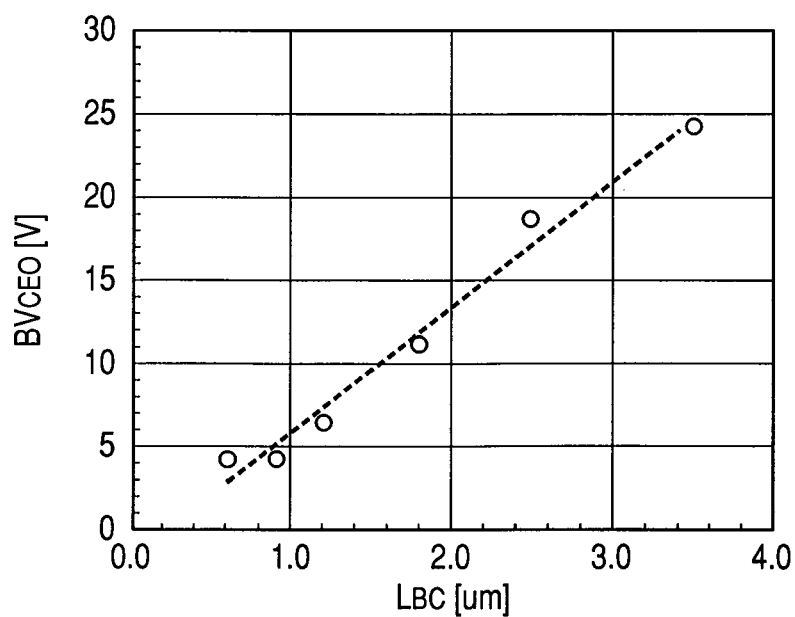
FIG. 3B shows the dependency of collector-emitter breakdown voltage by the open base ($BV_{CEO}$) between a collector and an emitter of a high voltage transistor upon distance ($L_{BC}$) between a base region 9 and a collector plug region 4 as a result of the evaluation of the electric characteristics in the embodiment shown in FIG. 2.

FIGS. 3A and 3B show one example showing the evaluation of electric characteristics of transistors produced by way of trial by applying the embodiment shown in FIG. 2. FIG. 3A shows relation between a current gain cut-off frequency ($f_T$) and collector-emitter breakdown voltage by the open base ($BV_{CEO}$). FIG. 3A shows an embodiment when distance ($L_{BC}2$) between a base region 9 and a collector plug region 4 is extended as shown in the third high voltage transistor 2 and further, plural transistors different in distance ($L_{BC}2$) between each base region 9 and each collector plug region 4 are arranged on the same wafer. The first high-speed transistor and the plural high voltage transistors different in collector-emitter breakdown voltage can be mounted together without deteriorating characteristics of the first high-speed transistor as in the related art. In this embodiment, difference in the collector-emitter breakdown voltage by the open base ($BV_{CEO}$) between the high-speed transistor and the high voltage transistor can be increased up to 20 V or more. FIG. 3B shows the dependency of the collector-emitter breakdown voltage by the open base ($BV_{CEO}$) in the third high voltage transistor upon distance ($L_{BC}$) between the base region 9 and the collector plug region 4. The transistor having desired collector-emitter breakdown voltage in a range of 4 to 25 V can be mounted together on the same wafer as the first high-speed transistor by adjusting the distance ($L_{BC}$) between the base region 9 and the collector plug region 4 of the third high voltage transistor and setting an arbitrary value. In this embodiment, the first high-speed transistor is formed on the same wafer as the second and third high voltage transistors, however, in a scope in which the invention is applied, structure that plural transistors the distance of which is different from the distance ($L_{BC}2$) between the base region 9 and the collector plug region 4 are arranged on the same wafer without forming a first high-speed transistor may be also included.

Figure 4:
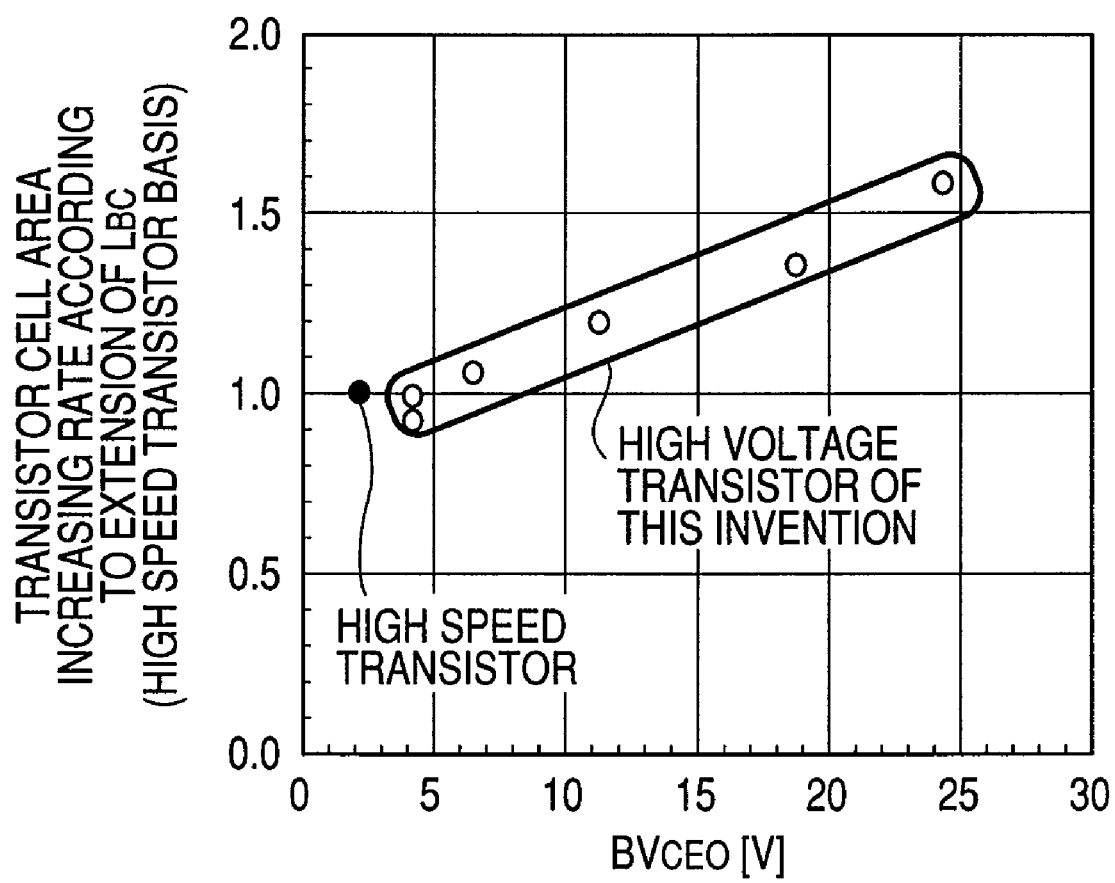
FIG. 4 shows relation between collector-emitter breakdown voltage by the open base ($BV_{CEO}$) and a high voltage transistor cell area increasing rate when the distance ($L_{BC}$) between the base region 9 and the collector plug region 4 in the embodiment shown in FIG. 2 is extended.

FIG. 4 shows relation between the collector-emitter breakdown voltage by the open base ($BV_{CEO}$) when the distance ($L_{BC}$) between the base region 9 and the collector plug region 4 of the third high voltage transistor is extended and a single high voltage transistor cell area increasing rate based upon the cell area of the high-speed transistor. When the distance ($L_{BC}$) between the base region 9 and the collector plug region 4 is extended to enhance the collector-emitter breakdown voltage by the open base ($BV_{CEO}$), there is a defect that the cell area increases by substantially 50% when the collector-emitter breakdown voltage by the open base ($BV_{CEO}$) is 20 V, however, as the transistors different in collector-emitter the breakdown voltage can be mounted together, circuit configuration can be simplified. When the high voltage bipolar transistor accounts for a small rate in chip size, an effect upon the increase of the manufacturing cost is also small.

According to this embodiment, when the plural high-voltage transistors are provided, the plural bipolar transistors different in collector-emitter breakdown voltage can be mounted together on the same wafer in the simple process.

Third Embodiment

Figure 5:
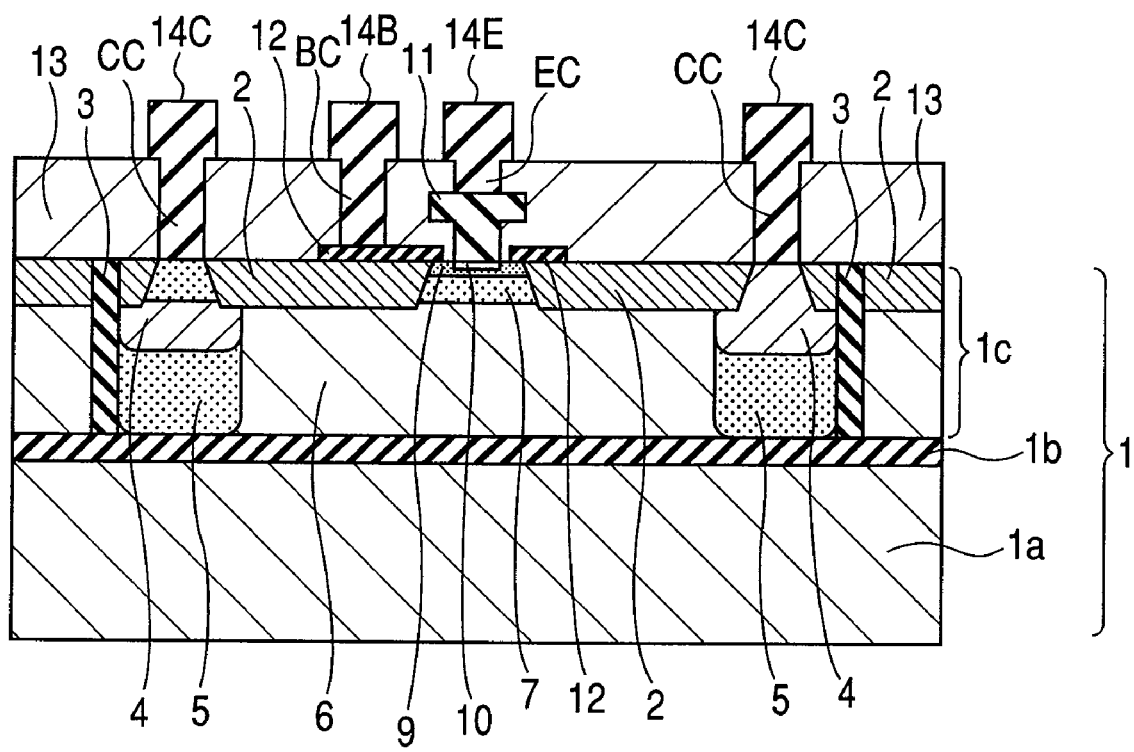
FIG. 5 is a sectional view showing further another embodiment of the invention and shows structure where the increase of collector resistance is inhibited by providing a collector plug region 4 on both sides of an emitter region 10.

FIG. 5 shows further another embodiment of the invention. Double collector structure in which collector resistance is reduced by providing two collector plug regions 4 on both sides of an emitter region 10 to be symmetrical based upon the emitter region 10 is shown.

Figure 6A:
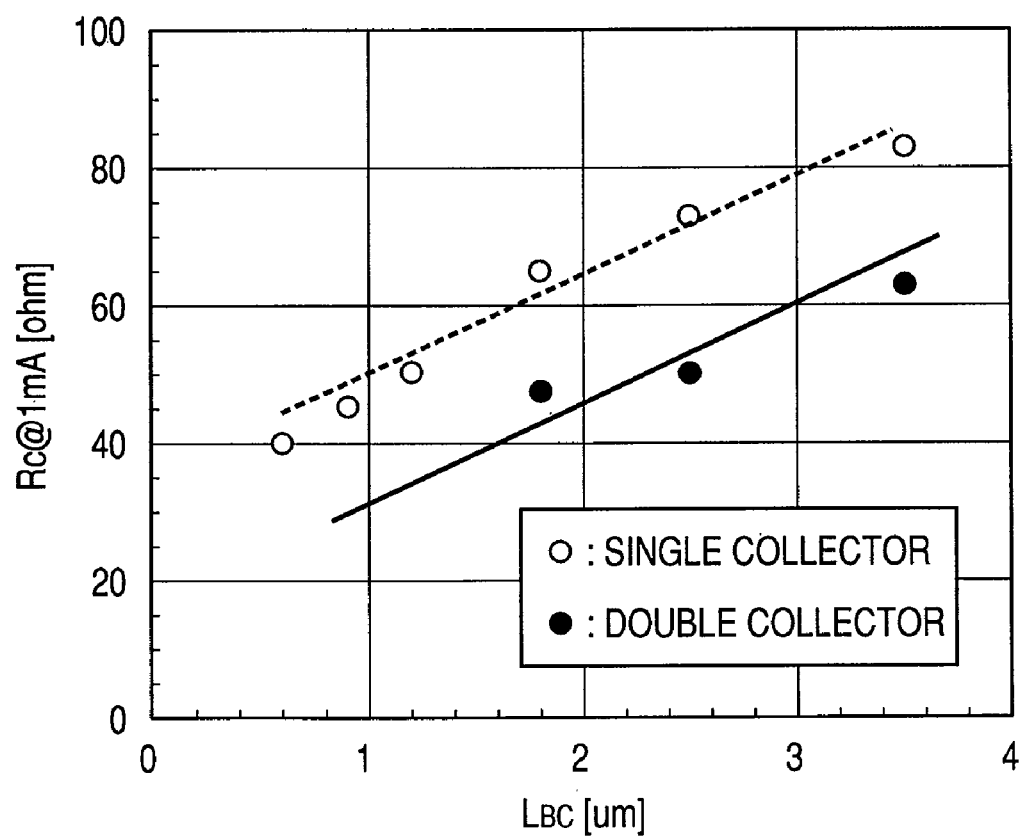
FIG. 6A shows the dependency of collector resistance ($R_C$) upon distance ($L_{BC}$) between a base region 9 and the collector plug region 4 as a result of checking the embodiment shown in FIG. 5 in view of electric characteristics and FIG. 6B shows relation between a current gain cut-off frequency ($f_T$) and collector-emitter breakdown voltage by the open base ($BV_{CEO}$) as a result of checking the embodiment shown in FIG. 5 in view of the electric characteristics.
Figure 6B:
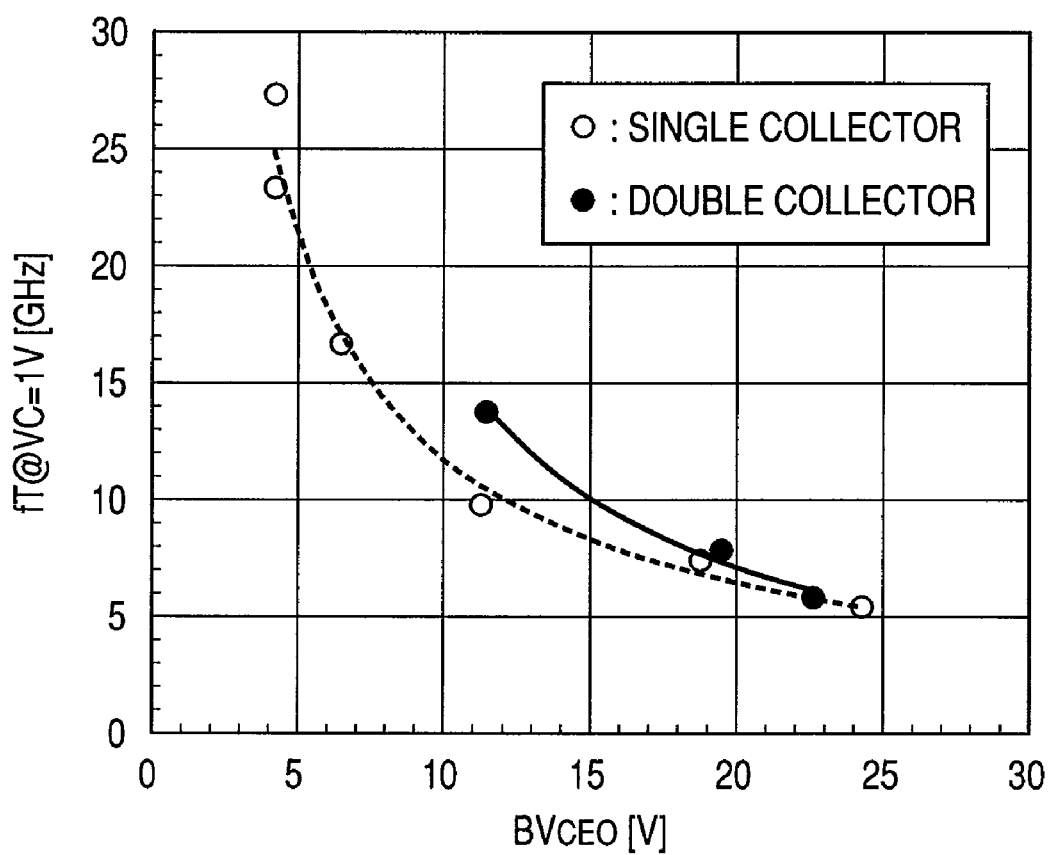
Figure 7:
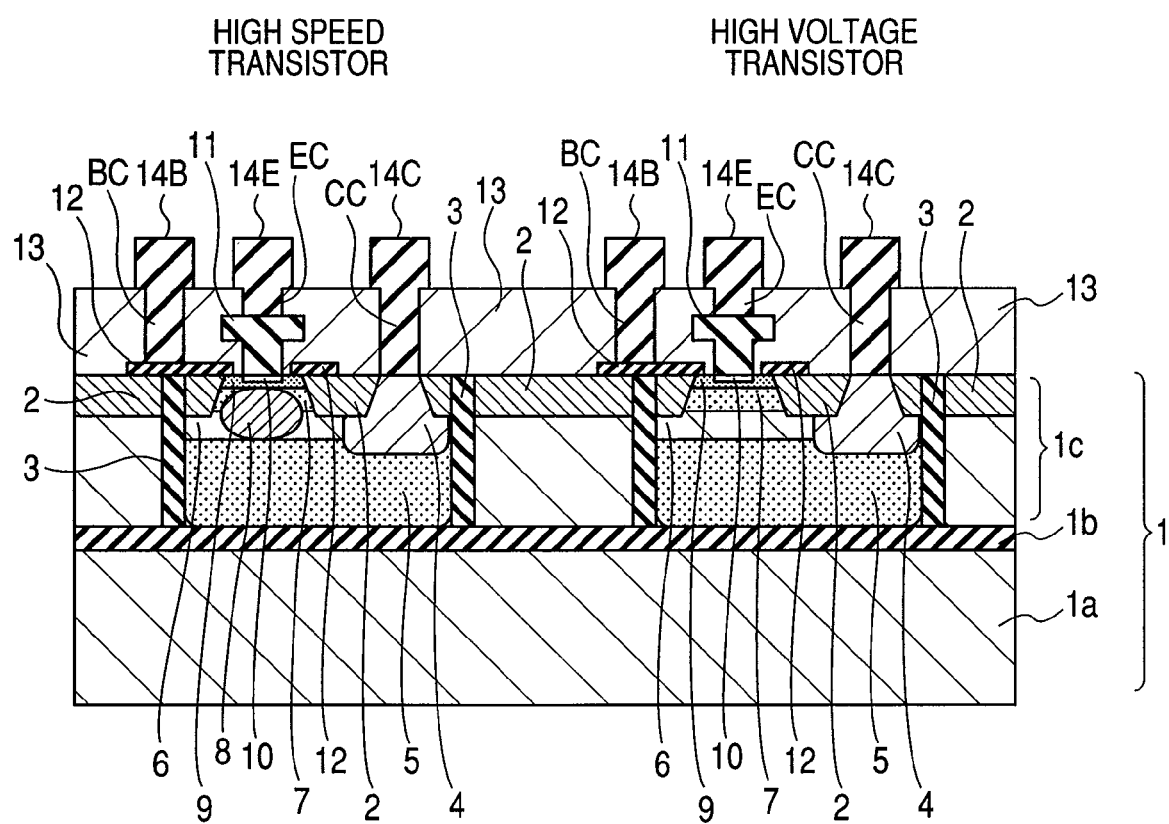
FIG. 7 shows one example of sectional structure when transistors different in collector-emitter breakdown voltage depending upon whether an SIC region is provided or not are manufactured on the same wafer, which shows device configuration examined by the inventors on their own terms prior to the invention.
Figure 8:
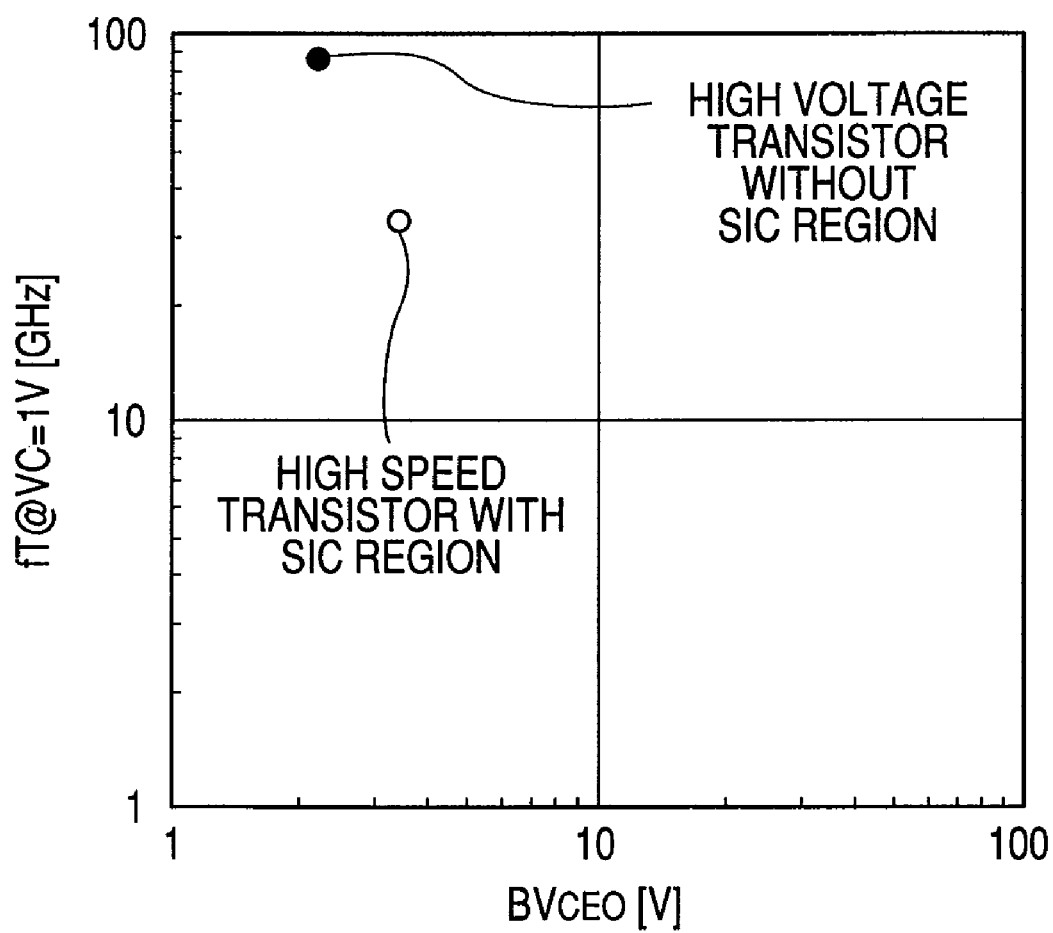
FIG. 8 shows one example of an electric characteristic in an embodiment shown in FIG. 7 and shows relation between a current gain cut-off frequency ($f_T$) and collector-emitter breakdown voltage by the open base ($BV_{CEO}$)
Figure 9A:
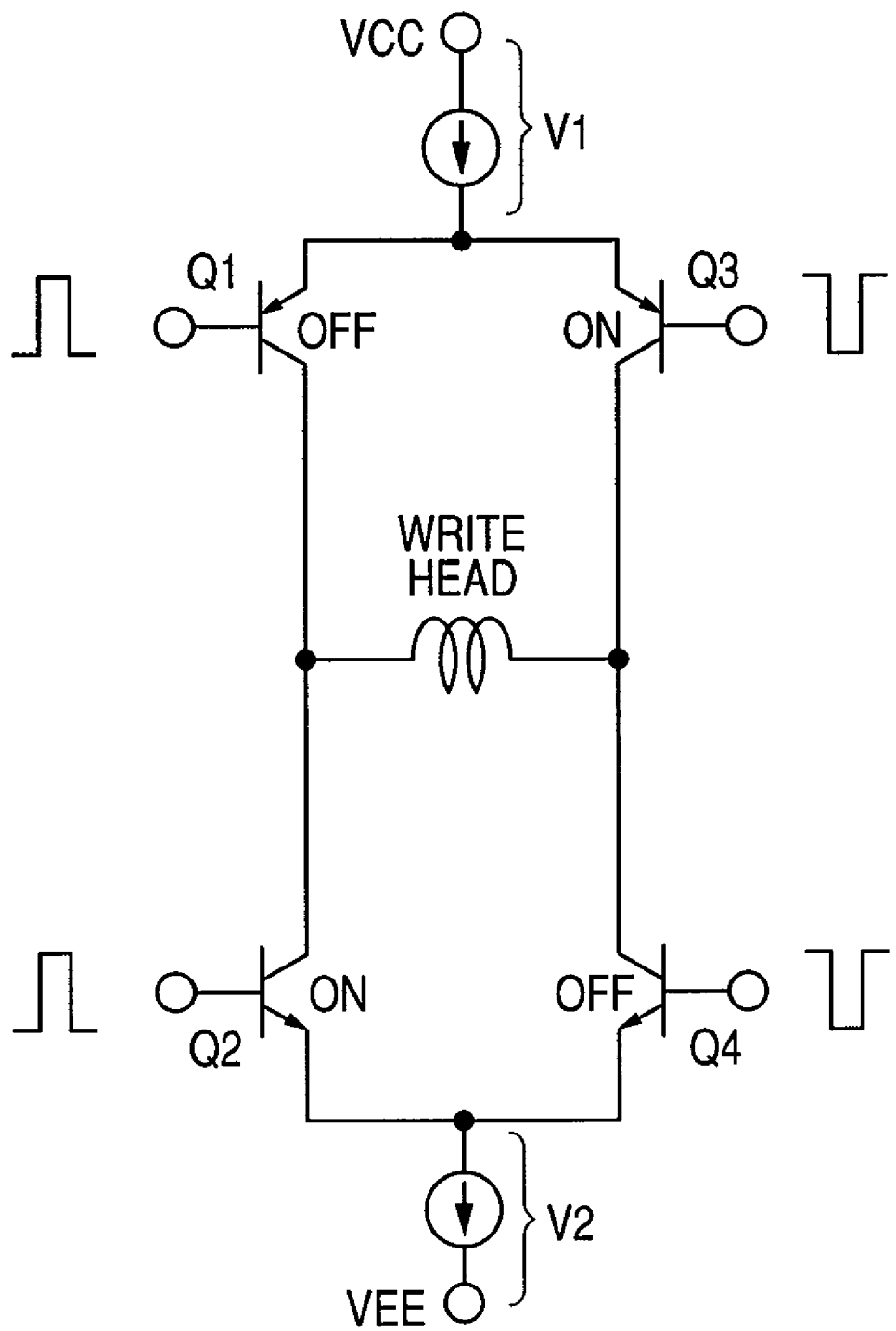
FIG. 9A shows an example of the circuit configuration of a circuit for driving a magnetic head when the collector-emitter breakdown voltage of a transistor (BJT) is enough and FIG. 9B shows an example of the circuit configuration of the circuit for driving the magnetic head when the collector-emitter breakdown voltage of the transistor (BJT) is not enough.
Figure 9B:
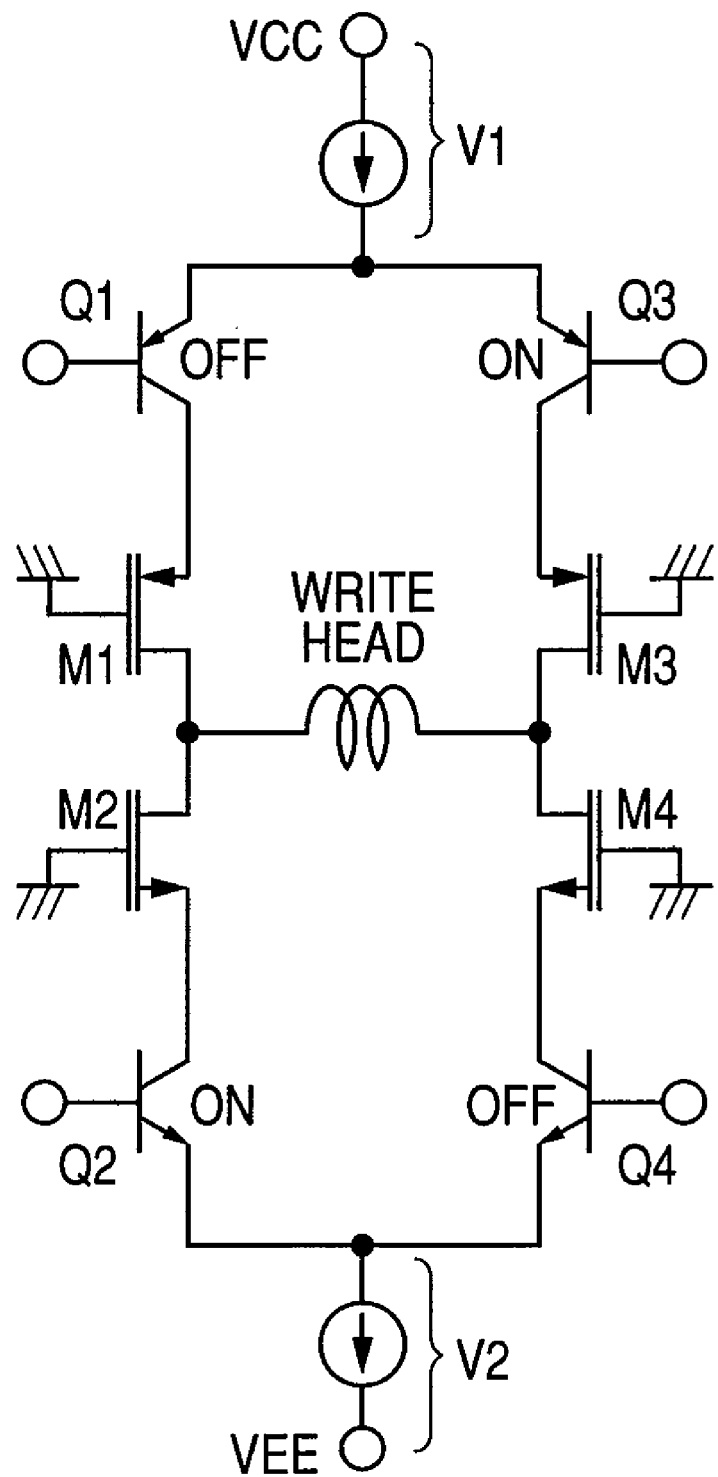

FIGS. 6A and 6B show results of checking the embodiment shown in FIG. 5 in view of electric characteristics. FIG. 6A shows a result of comparing the case of one collector plug region 4 (a single collector type) shown in FIG. 2 and the case of the double collector structure (a double collector type) shown in FIG. 5 in view of collector resistance ($R_C$). Collector resistance of substantially 30% can be reduced by adopting the double collector structure, compared with the case of one collector plug region 4. FIG. 6B shows relation between a current gain cut-off frequency ($f_T$) and collector-emitter breakdown voltage by the open base ($BV_{CEO}$). When the collector-emitter breakdown voltage by the open base ($BV_{CEO}$) is substantially equal to or is larger than 20 V, difference in the current gain cut-off frequency ($f_T$) between the case of the double collector structure and the case of one collector plug region is small, however, when the collector-emitter breakdown voltage by the open base ($BV_{CEO}$) is substantially equal to 10 V, the current gain cut-off frequency ($f_T$) of the double collector structure can be increased. This is the effect of the reduction of thermal resistance and the reduction of heat generated by the transistor respectively because the area of the transistor increases because of the double collector structure and though there is a defect that device size is increased, there are advantages that the collector resistance can be reduced and the current gain cut-off frequency ($f_T$) can be increased.

Fourth Embodiment

Figure 10:
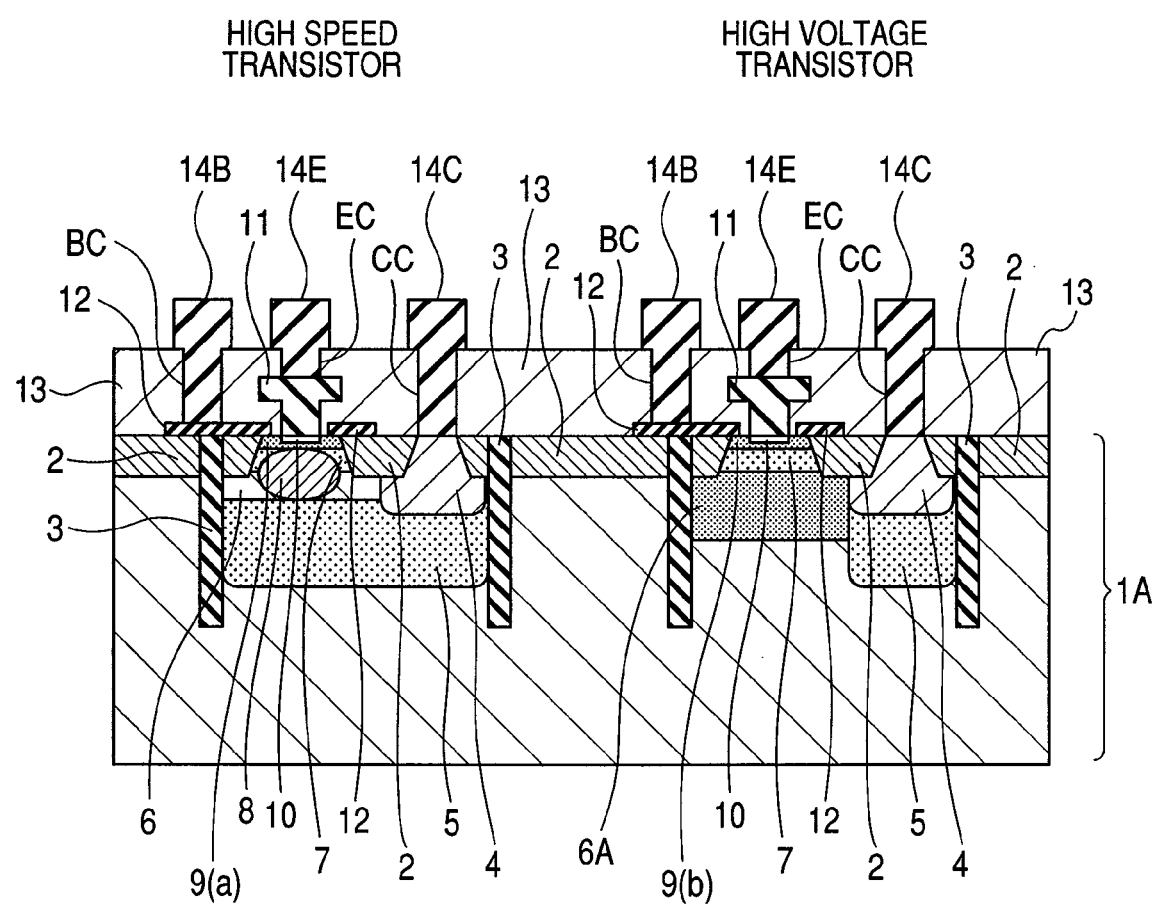
FIG. 10 shows one embodiment of the invention when a P-type bulk substrate is used.

FIG. 10 is a sectional view showing one embodiment of the invention when a P-type bulk substrate is used. Though the NPN high voltage transistor equivalent to one embodiment of the invention when the SOI substrate shown in FIG. 1 is used is shown in FIG. 1, structure that a low-density N-type collector region 6A is formed under a collector epitaxial collector layer 7 by implanting ion is shown in FIG. 10. When the P-type bulk substrate is used, the structure including the low-density N-type collector region 6A is used so as to prevent a collector plug region 4 or a buried region 5 and the epitaxial collector layer 7 from being isolated by the P-type substrate in a case that the epitaxial collector layer 7 is thinner than the depth of a shallow isolating part 2. The low-density N-type collector region 6A is provided only to electrically connect the epitaxial collector layer 7 and the collector plug region 4 or the buried region 5 respectively isolated by the P-type substrate and is different from the N-type buried layer. Compared with one embodiment of the invention when the SOI substrate shown in FIG. 1 is used, an ion implanting process for forming the low-density N-type collector region 6A is additionally required, however, a first high-speed transistor and plural high voltage transistors different in breakdown voltage can be mounted together without deteriorating the characteristics of the first high-speed transistor in the related art by varying distance $L_{BC}$ between a base region 9 and the collector plug region 4 as in the case described in the second embodiment.

According to this embodiment, when the high voltage transistor having the double collector structure is mounted together with the high-speed transistor, the plural bipolar transistors different in collector-emitter breakdown voltage can be mounted together on the same wafer in a simple process.

In the semiconductor devices described in the first to third embodiments, as no buried collector region in which impurity density is high is provided immediately under the base region of the second high voltage bipolar transistor, the collector-base breakdown voltage by the open emitter ($BV_{CBO}$) is higher than that of the first high-speed bipolar transistor. In the meantime, as there is not great difference between the emitter Gummel number and the base Gummel number, there is hardly difference between the first high-speed bipolar transistor and the second high voltage bipolar transistor as to the current gain ($h_{FE}$) of the bipolar transistor. Generally, the collector-emitter breakdown voltage by the open base ($BV_{CEO}$) of the bipolar transistor is acquired according to an expression shown in the following item of a mathematical expression 1:

$$BV_{CEO} \cong BV_{CBO}/n\sqrt{h_{FE}}$$

As a result, the collector-emitter breakdown voltage of the second high voltage bipolar transistor can be increased, compared with that of the first high-speed bipolar transistor.

Besides, the increase of collector resistance is inhibited by providing the buried collector region in the collector plug region of the second high voltage bipolar transistor or by arranging the collector plug region on both right and left sides of the emitter region.

In addition, a manufacturing process of the first high-speed bipolar transistor is utilized for forming the second high voltage bipolar transistor as it is and as no special process is required, the manufacturing cost can be reduced, compared with that in the related art described in the patent documents 1 and 2.

Besides, as $BV_{CBO}$ can be more increased by isolating the base region and the collector plug region in the second high voltage bipolar transistor, the breakdown voltage can be greatly enhanced, compared with $BV_{CEO}$ of the first high-speed bipolar transistor.

In addition, the plural bipolar transistors different in collector-emitter breakdown voltage can be simultaneously and easily manufactured on the same wafer by arranging the plural bipolar transistors different in distance between the base region and the collector plug region in the second high voltage bipolar transistor.

Further, according to the above-mentioned each embodiment, in the semiconductor device where the high-speed bipolar transistor and the high voltage bipolar transistor are manufactured on the same wafer, the variation of the collector-emitter breakdown voltage of the high voltage bipolar transistor is enabled. Recently, ICs for various purposes are manufactured and demands for IC having various breakdown voltage increase, however, in the above-mentioned each embodiment of the invention, as the breakdown voltage can be controlled by varying the distance between the base region 9 and the collector plug region 4 in a lateral direction of the semiconductor device, that is, in a planar direction of the semiconductor substrate 1, no process for changing the manufacturing process of the first high-speed bipolar transistor and adding is required, compared with a case (for example, the example in the patent document 1) that breakdown voltage cannot be controlled without varying distance (layer thickness) in a vertical direction, that is, in a laminated direction of a semiconductor device, and the semiconductor device of various breakdown voltage can be manufactured. Hereby, the invention can securely meet a demand for IC having various breakdown voltages.

What is claimed is:

1. A semiconductor device comprising:
    a substrate provided with an epitaxial layer of a semiconductor having a certain thickness with a low impurity density, said epitaxial layer having a first area and a second area electrically isolated from each other;
    a first bipolar transistor having a first emitter region, a first base region and a first collector region formed in said first area and a first collector contact fixed to said first collector region, said first collector region including a first buried region of a high impurity density expanding underneath the first collector contact and said first base region so as to allow the first bipolar transistor to operate under a high frequency; and
    a second bipolar transistor having a second emitter region, a second base region and a second collector region formed in said second area and a second collector contact fixed to said second collector region, said second collector region including a high resistivity region of the epitaxial layer expanding underneath the second base region and a second buried region formed underneath the second collector contact but not underneath the second base region, said second buried region having an impurity density profile which is substantially the same as that of the first buried region of said first bipolar transistor so as to provide the second bipolar transistor with a high collector-emitter breakdown voltage;
    wherein the first and second base regions, the first and second emitter regions, and the first and second buried regions for the first and second bipolar transistors are formed through the same manufacturing processes applied to the substrate, respectively,
    whereby the first and second bipolar transistors are operable under a high frequency and with a collector-emitter breakdown voltage, and are formed on the same substrate through the same and simultaneous manufacturing processes applied to the epitaxial layer.

2. The semiconductor device according to claim 1,
    wherein the impurity density of a portion of the first collector region located immediately under the first base region of the first bipolar transistor is higher than the impurity density of a portion of the second collector region located immediately under the second base region of the second bipolar transistor.

3. The semiconductor device according to claim 1,
    wherein each of the first and the second bipolar transistors is formed with a respective collector plug region to which its collector contact is fixed and which contacts its buried region.

4. The semiconductor device according to claim 3,
wherein the impurity density of a portion of the first collector region located immediately under the first base region of the first bipolar transistor is higher than the impurity density of a portion of the second collector region immediately located under the second base region of the second bipolar transistor.

5. The semiconductor device according to claim 4,
wherein a portion of the second collector region located immediately under the second base region of the second bipolar transistor is maintained with the high resistivity of the epitaxial layer.

6. The semiconductor device according to claim 5,
wherein a portion of the first collector region located immediately under the first base region of the first bipolar transistor is formed of a resistivity lower than that of the epitaxial layer.

7. The semiconductor device according to claim 3,
wherein a distance between the second base region and the collector plug region of the second bipolar transistor is equal to or is longer than that between the first base region and the collector plug region of the first bipolar transistor.

8. The semiconductor device according to claim 7,
wherein said second area is formed with a plurality of the second bipolar transistors different in distance between the second base region and the collector plug region thereof from each other, wherein the second bipolar transistors are formed in zones in said second area electrically isolated from each other.

9. A semiconductor device comprising:
a substrate;
a first semiconductor area formed on a major surface of said substrate with a certain thickness, said first semiconductor area being formed with a first bipolar transistor having a first emitter region, a first base region, a first collector region, and a first collector contact fixed to said first collector region, said first collector region including a first collector plug to which the first collector contact is fixed, a first buried region of a high impurity density expanding underneath the first collector plug and said first base region so as to allow the first bipolar transistor to operate under a high frequency; and
a second semiconductor area formed on said major surface of said substrate with the same thickness as that of said first semiconductor area and electrically isolated from said first semiconductor area, said second semiconductor area being formed with a second bipolar transistor of the same conductivity type as that of said first bipolar transistor and having a second emitter region, a second base region, a second collector region, and a second collector contact fixed to said second collector region, said second collector region including a second collector plug to which the second collector contact is fixed, a high resistivity region expanding under, and contacting, the second base region, and a second buried region of a high impurity density formed underneath the second collector plug but not underneath the second base region so as to provide the second bipolar transistor with a high collector-emitter breakdown voltage;
wherein said first and second emitter regions are formed with the same impurity density profile as that of the first conductivity type, said first and second base regions are formed with the same impurity density profile as that of the second conductivity type and with the same base depth, and said first and second collector plugs and said first and second buried regions in said first and second bipolar transistors are formed with the same impurity density profile as that of the first conductivity type, respectively,
whereby the first and second bipolar transistors are operable under a high frequency and with a collector-emitter breakdown voltage, and are formed on the same substrate through the same and simultaneous manufacturing processes applied to said first and second semiconductor areas.

10. The semiconductor device according to claim 9,
wherein said first bipolar transistor is formed with a further region of a high impurity density in the first collector region under the first base region.

11. The semiconductor device according to claim 9,
wherein a distance between the second base region and the second collector region in the second bipolar transistor is equal to or is longer than that between the first base region and the first collector region in the first bipolar transistor.

12. A semiconductor device comprising:
a substrate provided with an insulating layer thereon, a first semiconductor area formed on said insulating layer with a certain thickness, and a second semiconductor area formed on said insulating layer with the same thickness as that of said first semiconductor area, said second semiconductor area being electrically isolated from said first semiconductor area;
a first bipolar transistor formed in said first semiconductor area with a first emitter region, a first base region and a first collector region having a first buried region of a high impurity density buried underneath said first base region; and
a second bipolar transistor formed in said second semiconductor area with a second emitter region, a second base region and a collector region, the second collector region having a region of a low impurity density, which expands from the bottom of the second base region to said insulating layer, and a second buried region of a high impurity density formed in a portion of the second collector region but not underneath said second base region;
wherein said first and second emitter regions, said first and second base regions, and said first and second buried regions in said first and second bipolar transistors are formed through the same manufacturing processes applied to said first and second semiconductor areas, respectively,
whereby the first and second bipolar transistors are operable under a high frequency and with a collector-emitter breakdown voltage, and are formed on the same substrate through the same and simultaneous manufacturing processes applied to said first and second semiconductor areas.

13. The semiconductor device according to claim 12,
wherein said first bipolar transistor is formed with a further region of a high impurity density in the first collector region immediately under the first base region.

14. The semiconductor device according to claim 12,
wherein each of said first and second bipolar transistors is formed with a respective collector plug to which a respective collector is fixed,
wherein a distance between the second base region and the collector plug region in the second bipolar transistor is equal to or is longer than that between the first base region and the collector plug region in the first bipolar transistor.

15. The semiconductor device according to claim 14, wherein said second semiconductor area is formed with a plurality of the bipolar transistors different in distance between the base region thereof and the collector plug region thereof from each other, said plurality of bipolar transistors being formed in zones of said second semiconductor area electrically isolated from each other.

16. A semiconductor device comprising:

a substrate;

a plurality of semiconductor areas formed on a major surface of said substrate with the same thickness;

electrical isolation means configured to electrically isolate said semiconductor areas from one another and from said substrate;

a plurality of bipolar transistor configurations formed in said plurality of semiconductor areas, respectively, said plurality of bipolar transistor configurations being of the same conductivity type, in which each bipolar transistor is formed with a base region of a first conductivity type having the same impurity density profile and with the same base depth, an emitter region of the second conductivity type formed on the base region, a collector region of the second conductivity type underlying the base region within the same thickness of the semiconductor areas, at least one collector plug region of the second conductivity type, a collector contact electrically connected to the collector plug region, and a buried region having a high impurity density of the second conductivity type and formed with the same impurity density profile, wherein a first type of said bipolar transistor configurations is configured with the buried region expanding underneath the second base region and the collector plug region thereby to provide a bipolar transistor configuration of a high frequency operation, and wherein a second type of said bipolar transistor configurations is configured with the buried region formed underneath the collector plug region but not underneath the base region thereby to provide a bipolar transistor configuration of a high collector-emitter breakdown voltage.

17. The semiconductor device of claim 16, comprising two of said second type of the bipolar transistor configurations in which one is formed with a shorter distance of the base region thereof from the collector plug region thereof, and in which another is formed with a longer distance of the base region thereof from the collector plug region thereof.

18. The semiconductor device of claim 17, wherein said second type of the bipolar transistor configurations comprises two of the collector plug regions arranged so that the emitter region is located between the two collector plug regions.

19. A semiconductor device comprising:

a substrate provided with an epitaxial layer of a semiconductor having a certain thickness with a low impurity density, said epitaxial layer having a first area and a second area electrically isolated from each other;

a first bipolar transistor having a first emitter region, a first base region and a first collector region formed in said first area and a first collector contact fixed to said first collector region, said first collector region including a first buried region of a high impurity density expanding underneath the first collector contact and said first base region so as to allow the first bipolar transistor to operate under a high frequency; and a second bipolar transistor having a second emitter region, a second base region and a second collector region formed in said second area and a second collector contact fixed to said second collector region, said second collector region including a high resistivity region of the epitaxial layer expanding underneath the second base region and a second buried region formed underneath the second collector contact but not underneath the second base region, said second buried region having an impurity density profile which is substantially the same as that of the first buried region of said first bipolar transistor so as to provide the second bipolar transistor with a high collector-emitter breakdown voltage;

wherein the first and second base regions, the first and second emitter regions, and the first and second buried regions for the first and second bipolar transistors are formed through the same manufacturing processes applied to the substrate, respectively, wherein each of the first and the second bipolar transistors is formed with a respective collector plug region to which its collector contact is fixed and which contacts its buried region, and wherein two of the collector plug regions are arranged in said second area so that the emitter region is located between the two collector plug regions in the second bipolar transistor, whereby the first and second bipolar transistors are operable under a high frequency and with a collector-emitter breakdown voltage, and are formed on the same substrate through the same and simultaneous manufacturing processes applied to the epitaxial layer.

* * * * *